United States Patent [19]

Rosen et al.

[11] 4,110,700
[45] Aug. 29, 1978

[54] ELECTRONICALLY TUNABLE MICROWAVE FREQUENCY FET DISCRIMINATOR

[75] Inventors: Arye Rosen, Cherry Hill; Edward Mykietyn, West Windsor, both of N.J.

[73] Assignee: RCA Corporation, New York, N.Y.

[21] Appl. No.: 845,211

[22] Filed: Oct. 25, 1977

[51] Int. Cl.² .............................................. H03D 3/26
[52] U.S. Cl. ................................ 329/103; 307/233 R; 325/349; 328/140; 329/119; 329/134; 329/192; 329/205 R
[58] Field of Search ............... 329/103, 116, 119, 134, 329/192, 205 R, 206; 307/233 R; 328/140; 330/35; 325/349

[56] References Cited

U.S. PATENT DOCUMENTS

| | | | |
|---|---|---|---|
| 3,163,826 | 12/1964 | Kemper | 329/119 X |
| 3,676,785 | 7/1972 | Pichal | 329/103 |
| 3,975,699 | 8/1976 | Van Anda et al. | 328/140 X |

Primary Examiner—Siegfried H. Grimm
Attorney, Agent, or Firm—H. Christoffersen; Joseph D. Lazar; Robert M. Rodrick

[57] ABSTRACT

A microwave frequency discriminator comprising a field effect transistor (FET) amplifier including an electronically variable capacitor (varactor), a biasing circuit and a detector. The FET is biased to generate an output RF signal within a predetermined frequency bandwidth in response to an input RF signal of substantially constant power level. The variable capacitor is biased to electronically provide a predetermined impedance to the transistor to augment the frequency roll-off characteristic of the FET. The biasing circuit is used to electronically match the impedance of the FET output to the input of the detector. At such impedance conditions the dc output voltage of the detector varies substantially linearly throughout the frequency bandwidth as a function of the frequency of the input RF signal, approximating the characteristic of a frequency discriminator.

14 Claims, 3 Drawing Figures

ELECTRONICALLY TUNABLE MICROWAVE FREQUENCY FET DISCRIMINATOR

The Government has rights in this invention pursuant to Contract No. N00039-76-C-0280 awarded by the Department of the Navy.

CROSS REFERENCE TO RELATED APPLICATIONS

Of interest are the following applications: Ser. No. 722,585 (RCA 70,204) filed Sept. 13, 1976, now U.S. Pat. No. 4,053,842, entitled "Microwave Frequency Discriminator Comprising an FET Amplifier," based on the invention of Daniel D. Mawhinney and Zygmond Turski; Ser. No. 722,582 (RCA 70,994) filed Sept. 13, 1976, now U.S. Pat. No. 4,053,841, entitled "Microwave Frequency Discriminator Comprising an FET Amplifier," based on the invention of Arye Rosen and Louis S. Napoli, both assigned to the same assignee as is the present invention.

BACKGROUND OF THE INVENTION

1. Field of the Invention

This invention relates to a microwave frequency discriminator and more particularly to a discriminator comprising a field effect transistor including biasing circuits for obtaining electronically predetermined transistor input and output impedance conditions.

2. Description of the Prior Art

Techniques and devices for the rapid and accurate determination of an unknown signal frequency are of significant interest in modern communication systems, in particular, for electronic counter measure (ECM) systems operating at microwave frequencies. Microwave frequency discriminators capable of converting incoming unknown frequencies into voltages for processing are often used in ECM systems. A microwave frequency discriminator may be defined as a circuit that provides an output voltage which is a predetermined function of and usually proportional to the frequency of an incoming signal. The discriminator voltage output versus frequency response, commonly termed the "discriminator characteristic," is the response in which the output voltage varies nearly linearly with respect to frequency over a predetermined frequency bandwidth. The bandwidth is generally determined by the slope, linearity, and resolution of the discriminator and is the frequency range over which the discriminator provides an unambiguous voltage output which is related to the input frequency.

A typical broadband microwave discriminator often utilized in modern systems comprises passive elements such as transmission lines or an arrangement of lumped elements to vary the power level of the input signal applied to a detector diode as a function of frequency. Such a discriminator formed of various passive components, generally, disadvantageously, has a large number of connections between the components. These interconnections often produce impedance mismatches resulting in undesirable inflection points in the relation between input frequency and output voltage such that a particular voltage can occur at several frequencies. Such distortions in the discriminator characteristic limit the broadband resolution of the discriminator minimizing thereby the accuracy of the system.

To overcome such discriminator deficiencies, recent advances in the art have resulted in the minimization or elimination of the passive elements and the utilization instead of active elements, such as field effect transistors, to achieve the discriminator characteristic. As disclosed in the aforementioned patent applications, Ser. Nos. 722,582 and 722,585 respectively, FETs are arranged to produce an output voltage that varies substantially linearly with the frequency of an input RF signal throughout a certain frequency bandwidth. The impedance conditions for obtaining the discriminator characteristic with the FET are achieved in Ser. No. 722,585 by input and output shaping networks, and in Ser. No. 722,582 by an input shaping network and an output biasing circuit. The shaping networks in each application are typically arranged in microstrip form with the geometric shape of the network determining the impedance condition. The configuration for providing a desirable impedance is selected for a specific range of discriminator operating conditions. The configuration of the shaping networks for a given set of discriminator parameters is obtained by the use of computer iteration techniques to determine the particular geometric pattern. Fine tuning of the discriminator characteristic is achieved by manually varying the location of tuning stubs on the microstrip circuit.

Although an improvement over the passive element type discriminator, the FET discriminator utilizing particularly configured shaping networks disadvantageously requires a selection process for determining the network geometry and thereby its impedance as well as the manual process of tuning by the manipulation of tuning elements or stubs. Such processes restrict the discriminator performance to a limited range of operating conditions since, once the configuration of the networks is determined, it is fixed subject only to minimal adjustments by the manual tuning. Manual tuning is problematical in such applications as well, since once the discriminator is in its intended operating environment, lack of accessibility may prohibit any further manual tuning.

SUMMARY OF THE INVENTION

According to the present invention, a microwave frequency discriminator comprises a transistor amplifier including a field effect transistor having first, second and third electrodes. The amplifier has an input port for receiving an input RF signal of substantially constant power level and an output port. The transistor is biased an amount for generating in response to the input RF signal an output RF signal having a predetermined frequency vs. gain roll-off characteristic within a predetermined frequency bandwidth. An electronically variable capacitive means is connected to the input port for providing a predetermined impedance condition at the transistor input port to augment the transistor frequency gain vs. roll-off characteristic. A detector responsive to the output RF signal generates a dc signal. Biasing means responsive to a predetermined bias voltage is included for matching the output impedance of the transistor with the input impedance to the detector. At such impedance conditions, the voltage of the dc signal varies substantially linearly as a function of the frequency of the input RF signal.

In an environment of a wide band RF signal of varying power level, limiter means may be used to provide an RF signal of substantially constant power level to the amplifier.

DETAILED DESCRIPTION OF THE PREFERRED EMBODIMENT

Figure 1:
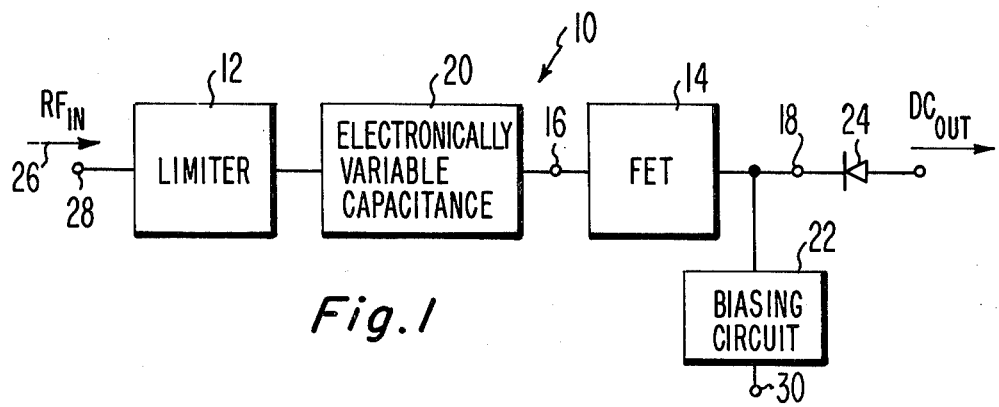
FIG. 1 is a schematic representation of a microwave frequency discriminator of the present invention.

Referring to the drawing, there is shown in FIG. 1, a schematic diagram of one embodiment of a microwave frequency discriminator 10. Discriminator 10 includes a limiter 12, a field effect transistor (FET) 14, having an input port 16 and an output port 18, electronically variable capacitance 20, a biasing circuit 22 and a detector diode 24, such as a beam lead Schottky diode.

An input RF signal 26 of unknown frequency, which may be of variable power level is applied to the input 28 and processed by limiter 12. The function of limiter 12 is to provide an output RF signal having a predetermined power level which is invariant with the power level and frequency of the incoming signal, so that it may be processed as hereinafter described. Limiter 12 is suitably a tunnel diode amplifier (TDA) coupled to a three-port circulator in which one port is suitably terminated to ground to provide the round return for variable capacitance 20. If the limiter (20) is not provided with a ground, then a suitable dc ground return for the capacitance 20 is needed as through a grounded RF choke to the line 21. Furthermore, it will be appreciated and understood that limiter 12 may be unnecessary and therefore eliminated if the incoming RF signal 26 has a relatively constant power level. As indicated above, a ground return for the capacitance 20 is needed when the limiter is not provided.

In a preferred embodiment of the invention, FET 14 is a gallium-arsenide (GaAs) Schottky barrier field effect transistor for its desirable high gain properties in a selected frequency range, although any FET device may be used. FET 14 is arranged to operate as a transistor amplifier by application of a suitable bias voltage to generate an output RF signal having a predetermined frequency vs. gain roll-off characteristic. The bias voltage is applied as by biasing circuit 22, biasing circuit 22 being connected as by terminal 30 to a voltage source (not shown). Biasing circuit 22 is also used to provide desirable impedance matching conditions between FET 14 and detector diode 24 as will be explained in detail subsequently.

In a preferred embodiment of the invention, FET 14 and detector diode 24 are integrated on a single microwave integrated circuit (MIC) in a microstrip circuit transmission line to minimize the number of electrical connections and electrical lengths. Other transmission lines, such as, for example, coaxial line circuits, waveguide circuits and stripline circuits may also be used.

Figure 3:
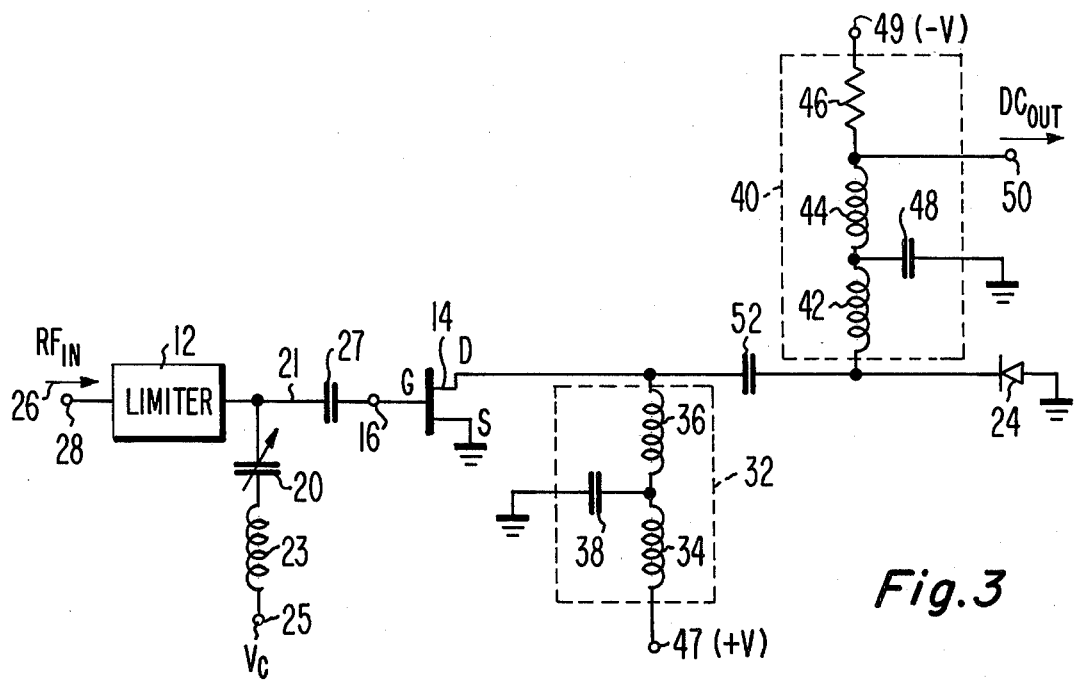
FIG. 3 is a schematic representation of the microwave discriminator of FIG. 1 according to a preferred embodiment of the invention.

In accordance with the preferred embodiment of the invention, as shown in FIG. 3, variable capacitance 20 is connected to the transmission line 21 between the limiter 12 output and the input port 16 of FET 14. Variable capacitance 20 is connected through an inductor 23, for example, to a dc voltage, $V_c$, (not shown) at terminal 25 to provide variable capacitance 20 with a suitable bias voltage. Inductor 23 serves as an RF choke or low pass filter. Accordingly any suitable network may be used to couple dc voltage to capacitor 20. A blocking capacitor 27 is used in transmission line 21 to isolate the variable capacitance 20 biasing voltage ($V_c$) from the RF signal 26.

Variable capacitance 20 is a varactor diode in the preferred embodiment of the invention and may be in discrete or planar form arranged to be suitably connected or integrated with the microstrip circuit configuration of the present invention. By electronically changing the capacitance of the varactor diode 20 by the application of biasing voltage $V_c$, the impedance conditions of the transmission line 21 are varied. Such electronic control of the impedance conditions of the transmission line is utilized in accordance with the present invention to augment the FET roll-off characteristic such that the roll-off characteristic varies substantially linearly as a function of frequency. More specifically, the intrinsic property of an FET amplifier, having a frequency roll-off characteristic, is enhanced and linearized by the electronically variable capacitance 20.

Figure 2:
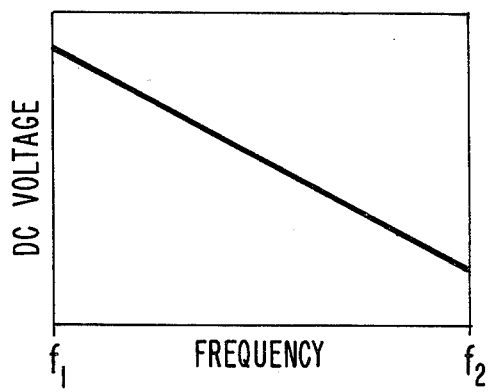
FIG. 2 is a graph showing dc voltage versus frequency useful in describing the present invention.

According to the present invention, biasing circuit 22, in addition to biasing FET 14, is utilized to match the output impedance of FET 14 with the input impedance of detector diode 24. At such conditions of matched impedances as provided by biasing circuit 22, the high frequency vs. gain roll-off characteristic of the FET 14 has a power-frequency response which is substantially linear throughout a predetermined frequency bandwidth. The high frequency vs. gain roll-off characteristic is augmented by variable capacitance 20, as explained above. Such a linear power-frequency response is converted by detector diode 24 to a substantially linear dc voltage vs. frequency response approximating a linear discriminator characteristic throughout the predetermined frequency range from $f_1$ to $f_2$ as shown in FIG. 2. For example, in the practice of the invention the frequency may be in the range of 7GHz to 11GHz.

In the preferred embodiment of the invention as detailed in FIG. 3, FET 14 has its three electrodes arranged as gate G, source S and drain D electrodes and a drain biasing circuit 32 electrically connected to drain electrode D. Circuit 32 is connected at terminal 47 to a pulsed or dc bias voltage (not shown) as the biasing drain voltage of FET 14. Circuit 32, comprising serially connected inductors 34 and 36 and a capacitor 38 connected in shunt to ground, serves as a filter network, blocking the RF signal from the drain bias voltage.

A detector biasing circuit 40 is electrically connected to the input (cathode) of detector diode 24 to bias the forward current through detector diode 24. Circuit 40 is connected at terminal 49 to a pulsed or dc voltage (not shown) to provide the detector with a voltage for biasing the forward current. Circuit 40, comprising serially connected inductors 42 and 44 and resistor 46 and a capacitor 48 connected to ground also serves as a filter network, blocking the RF signal from the detector bias voltage. In this preferred embodiment, one terminal (anode) of detector 24 is connected to ground and the dc voltage output is passed out by circuit 40 through terminal 50. In the configurations shown, the detector bias voltage is negative, however, it may be positive if the polarity of detector diode 24 is reversed. A blocking capacitor 52 is used to isolate the drain bias voltage from the detector bias voltage.

According to this embodiment of the invention, the matching condition between the output impedance of FET 14 and the input impedance to detector diode 24 is a function of both the drain voltage and the forward current through detector diode 24. The desired matching condition is achieved electronically by the biasing drain voltage and forward detector current as by drain biasing circuit 32 and detector biasing circuit 40, respectively. Such biasing may be achieved with either biasing circuit alone or in combination, the combined biasing providing a greater range of impedance condition variations. Furthermore, by applying to drain D and detector 24 a voltage from a variable voltage source, the impedance conditions can be electronically varied to change the slope of the substantially linear dc voltage-frequency response of the discriminator.

As previously described, the linear power-frequency signal of FET 14 is received by detector diode 24 and converted into a dc output signal for subsequent processing (not shown). It is preferable that detector diode 24 be of the square law type. A square law detector has a characteristic $V_{out} = kV_{in}^2$, where $k$ is the detector sensitivity factor, such that the output dc voltage will vary substantially linearly as a function of the input RF signal.

The microwave frequency discriminator of the present invention as herein described achieves the desired linear frequency discriminator characteristic by utilizing an FET in the transmission line circuit. Contrary to the active device (FET) discriminators as disclosed in application Ser. No. 722,582 and Ser. No. 722,585 in which either the input and output networks is designed with predetermined manually tunable impedances, the FET discriminator of the present invention achieves the desired input and output transistor impedance conditions electronically in both the input and output circuits without specifically configured shaping networks and manipulation of tuning elements. Such a discriminator as herein described reduces the selectivity of the active FET device and provides for tunability in any operating environment which is inaccessible except for electronic signals.

For the purposes of the present disclosure the term "passive" elements is intended to define the elements of the discriminator circuit coupling the input signal to the detector diode that are passive in the well known meaning of the word in this art. The term "active" elements is intended to define a discriminator network coupling the input signal to the detecting diode in which one or more of the elements is active. Thus the FET 14 included in the discriminator circuit defines such a circuit as being "active."

Although the invention can be used to scan for and detect signals of an unknown frequency in electronic counter-measure (ECM) systems, the invention can also be used in scanning for frequency modulated signals. The detector output will generate a dc signal representing the modulating signal.

What is claimed is:

1. A microwave frequency discriminator comprising:
a transistor amplifier including a field effect transistor having first, second and third electrodes, said transistor amplifier having an output port, and an input port for receiving an input RF signal of substantially constant power level, said transistor being biased an amount for generating in response to said input RF signal an output RF signal having a predetermined frequency vs. gain roll-off characteristic within a predetermined frequency bandwidth;
electronically variable capacitive means connected to said input port for providing a predetermined impedance condition at said transistor input port to augment said transistor frequency vs. gain roll-off characteristic;
detector means responsive to said output RF signal for generating a dc signal; and
biasing means responsive to a predetermined bias voltage for matching the output impedance of said transistor with the input impedance of said detector means,
whereby at said conditions of matched impedances the voltage of said dc signal varies substantially linearly as a function of the frequency of said input RF signal.

2. A microwave frequency discriminator according to claim 1, wherein said detector means comprises a square law detector.

3. A microwave frequency discriminator according to claim 1, wherein said predetermined bias voltage is variable, the slope of said substantially linear dc voltage-frequency response being adjustable with changes in said variable voltage.

4. A microwave frequency discriminator according to claim 1, wherein said biasing means comprises a detector biasing circuit electrically connected to said detector means for biasing the forward current through said detector means to provide said impedance matching conditions.

5. A microwave frequency discriminator according to claim 1, wherein said first, second and third transistor electrodes are arranged as gate, source and drain electrodes respectively, and wherein said biasing means comprises a drain biasing circuit electrically connected to said drain electrode for biasing the drain voltage of said field effect transistor to provide said impedance matching conditions.

6. A microwave frequency discriminator according to claim 5, wherein said biasing means further comprises a detector biasing circuit electrically connected to said detector means and means for blocking the bias voltage of said drain biasing circuit from the bias voltage of said detector biasing circuit, said detector biasing circuit combining with said drain biasing circuit to provide said impedance matching conditions.

7. A microwave frequency discriminator according to claim 1, wherein said electronically variable capacitive means comprises a varactor diode responsive to a predetermined bias signal.

8. A microwave frequency discriminator comprising:
signal limiting means responsive to an input RF signal of varying power level for generating an RF signal of substantially constant power level;
a transistor amplifier including a field effect transistor having first, second and third electrodes, said transistor amplifier having an output port, and an input port for receiving said RF signal of substantially constant power level, said transistor being biased an amount for generating in response to said RF signal of substantially constant power level an output RF signal having a predetermined frequency vs. gain roll-off characteristic within a predetermined frequency bandwidth;
electronically variable capacitive means connected to said limiting means and to said input port for providing a predetermined impedance condition at said transistor input port to augment said transistor frequency vs. gain roll-off characteristic;
detector means responsive to said output RF signal for generating a dc signal; and biasing means responsive to a predetermined bias voltage for matching the output impedance of said transistor with the input impedance of said detector means, whereby at said conditions of matched impedances the voltage of said dc signal varies substantially linearly as a function of the frequency of said input RF signal.

9. A microwave frequency discriminator according to claim 8, wherein said detector means comprises a square law detector.

10. A microwave frequency discriminator according to claim 8, wherein said predetermined bias voltage is variable, the slope of said substantially linear dc voltage-frequency response being adjustable with changes in said variable voltage.

11. A microwave frequency discriminator according to claim 8, wherein said biasing means comprises a detector biasing circuit electrically connected to said detector means for biasing the forward current through said detector means to provide said impedance matching conditions.

12. A microwave frequency discriminator according to claim 8, wherein said first, second and third transistor electrodes are arranged as gate, source and drain electrodes, respectively, and wherein said biasing means comprises a drain biasing circuit electrically connected to said drain electrode for biasing the drain voltage of said field effect transistor to provide said impedance matching conditions.

13. A microwave frequency discriminator according to claim 12, wherein said biasing means further comprises a detector biasing circuit electrically connected to said detector means for biasing the forward current through said detector means and means for blocking the bias voltage of said drain biasing circuit from the bias voltage of said detector biasing circuit, said detector biasing circuit combining with said drain biasing circuit to provide said impedance matching conditions.

14. A microwave frequency discriminator according to claim 8, wherein said electronically variable capacitive means comprises a varactor diode responsive to a predetermined bias signal.

* * * * *